United States Patent [19]

Lacy

[11] Patent Number: 4,843,260
[45] Date of Patent: Jun. 27, 1989

[54] VARIABLE THRESHOLD AMPLIFIER

[75] Inventor: Robert H. Lacy, Bartlesville, Okla.

[73] Assignee: Phillips Petroleum Company, Bartlesville, Okla.

[21] Appl. No.: 412,348

[22] Filed: Aug. 27, 1982

[51] Int. Cl.[4] .......................... H03K 5/153; H03K 5/24
[52] U.S. Cl. ..................................... 307/362; 307/290
[58] Field of Search ............... 307/350, 362, 363, 290; 330/261, 296

[56] References Cited

U.S. PATENT DOCUMENTS

| 2,801,338 | 7/1957 | Keller, Jr. | |
|---|---|---|---|
| 3,041,469 | 6/1962 | Ross. | |
| 3,365,586 | 1/1968 | Billings | 307/362 |
| 3,473,044 | 10/1969 | Moriyasu | 307/260 |
| 3,474,258 | 10/1969 | Nagy, Jr. | 307/255 |
| 3,487,233 | 12/1969 | Reap | 307/254 |
| 3,564,285 | 2/1971 | Gilbert | 307/234 |
| 3,569,739 | 3/1971 | Stolman | 328/146 |
| 3,573,495 | 4/1971 | Xylander | 328/150 |
| 3,579,094 | 5/1971 | Jorgensen | 307/362 |
| 3,599,015 | 8/1971 | Ulrick. | |
| 3,646,361 | 2/1972 | Pfiffner | 328/151 |
| 3,697,780 | 10/1972 | Michael et al. | 328/150 |
| 3,868,517 | 2/1975 | Schoeff | 307/263 |

Primary Examiner—John Zazworsky
Attorney, Agent, or Firm—George E. Bogatie

[57] ABSTRACT

A combination of an npn transistor, a pnp transistor and associated circuitry is utilized to provide a threshold amplifier which has a variable threshold. The voltage level at the emitter of the npn transistor, when the npn transistor is off, determines the variable threshold. A second pnp transistor is preferably utilized to provide a means by which the threshold voltage can be set to a very low voltage level.

3 Claims, 2 Drawing Sheets

VARIABLE THRESHOLD AMPLIFIER

This invention relates to variable threshold amplification. In one aspect, this invention relates to a variable threshold amplifier circuit the output of which varies linearly with the input signal to the circuit only when the input signal has a voltage level greater than the voltage level of the voltage threshold of the circuit. In another aspect this invention relates to a variable threshold amplifier circuit which provides a binary output signal in response to an analog input signal to the circuit with the level of the binary output signal being determined by whether the input signal has a voltage level greater than or less than the voltage level of the voltage threshold of the circuit.

Circuits which amplify a signal only when that signal has a voltage level greater than some designated voltage level are generally referred to as threshold amplifier circuits. Such circuits find application in a number of areas such as voltage comparison, threshold detection and video signal processing. The term amplification as used in connection with such circuitry generally refers to a linear amplification of the input signal to the circuitry. The amplification factor can be greater than 1, less than 1 or even 1. The term amplification as used herein refers to such linear amplification and also refers to a nonlinear amplification in which a binary high or "one" level is produced when the input signal is above the threshold and a binary low or zero level is produced when the input signal is below the threshold level.

In addition to the basic function of a threshold amplifier circuit, the following are some of the desirable characteristics for a threshold amplifier circuit:

1. Variable threshold voltage which can be set at a low level or even at ground.
 2. High speed operation from a single power supply.
 3. Wide dynamic range for the output signal.
 4. High stability if environmental conditions vary.
 5. Output voltage which may be zero even though the input voltage is not zero.

It is thus an object of this invention to provide a variable thrreshold amplifier circuit which both accomplishes the basic function of amplification of an input signal if the input signal exceeds the threshold voltage and has the desirable characteristics set forth above.

In accordance with the present invention, a variable threshold amplifier circuit is provided in which an npn transistor is biased in such a manner that the npn transistor turns on only when the input signal to the variable threshold amplifier circuit exceeds the variable threshold. When the npn transistor turns on, a pnp transistor contained in the variable threshold amplifier circuit also turns on and an amplified output signal is provided. A pnp transistor is utilized to provide a means by which the threshold voltage can be set to a very low level. The pnp transistor which turns on when the npn transistor turns on also provides a means by which a zero output voltage may be provided when the input signal is below the variable threshold which is particularly desirable in digital systems such as those which employ transistor-transistor logic (TTL).

Other objects and advantages of the invention will be apparent from the foregoing brief description of the invention and the claims as well as the detailed description of the drawings in which:

Figure 1:
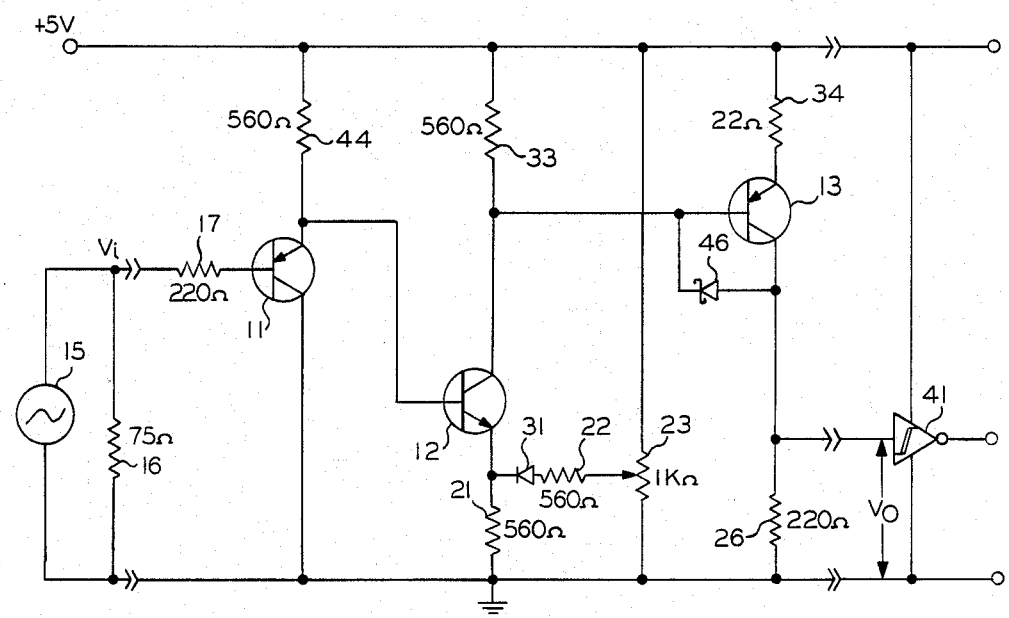
FIG. 1 is a schematic diagram of a first embodiment of the variable threshold amplifier circuit of the present invention.
Figure 3:
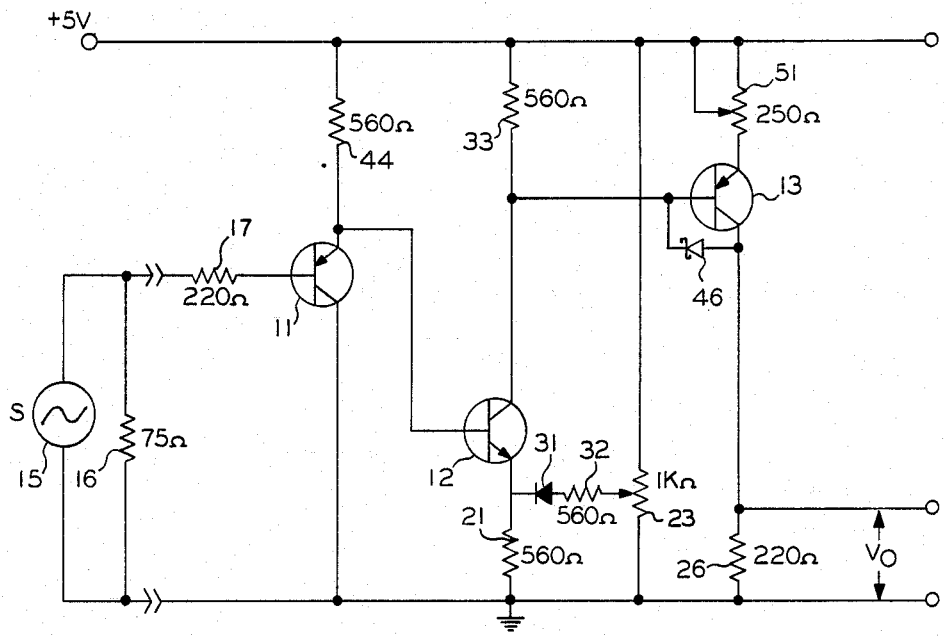
FIG. 3 is a second embodiment of the variable threshold amplifier circuit of the present invention.

In FIGS. 1 and 3, the transistors and Schmitt trigger illustrated as well as components such as resistors and diodes may be obtained from a number of manufacturers such as RCA, Motorola, Fairchild and National. The function of the transistors, Schmitt trigger and components is fully described by literature supplied by the manufacturers and the manner in which the transistors, Schmitt trigger and components would be obvious to one skilled in the art of electronics. Thus, only a general description of the operation of the transistors, Schmitt trigger and components is provided hereinafter with emphasis being placed on a detailed description of the function of the circuitry taken as a whole.

FIGS. 1 and 3 are described in terms of preferred voltage values and resistance values in order to clarify the description of the circuitry. Different voltage values and resistance values could be utilized if desired. Also, a zero voltage is used as the "ground" level to describe the operation of the circuits illustrated in FIGS. 1 and 3 but these circuits could be referenced to other voltages for a "ground" if desired.

Referring now to the drawings, the variable threshold amplifier illustrated in FIG. 1 is principally made up of three transistors and their associated circuitry. Transistor 11 is essentially utilized as a buffer circuit. Transistor 12 is essentially utilized as a voltage comparator. Transistor 13 is essentially utilized as a level shifter. Transistor 11 is configured as an emitter follower and each of transistors 12 and 13 are essentially configured as common emitter amplifiers.

An input signal is provided to the base of transistor 11 by the combination of the source 15, resistor 16 and resistor 17. The signal source is exemplary and could be any suitable signal source.

Before referring specifically to the functions of the various circuits illustrated in FIG. 1, it would be helpful to consider the voltages which will generally exist throughout the circuit. Essentially, the emitter of transistor 11 and base of transistor 12 will be at a voltage level which is substantially equal to the voltage level of the input signal to the base of transistor 11 plus 0.7 volts. The collector of transistor 12 will be at 5 volts when transistor 12 is off and will be at the voltage level of the emitter of transistor 12 plus about 0.3 volts when transistor 12 is fully on. The base voltage for transistor 13 will be the same as the collector voltage for transistor 12. The voltage level at the emitter of transistor 12 will be at a level determined by the values of resistors 21, 22 and 23 and diode 31 when transistor 12 is off, and will be at a voltage equal to the base voltage of transistor 12 minus 0.7 volts when transistor 12 is on.

The emitter of transistor 13 will be at 5 volts when transistor 13 is off and will be at a voltage level equal to the base voltage of transistor 13 plus 0.7 volts when transistor 13 is on. The output voltage across resistor 26 will have a value of zero when transistor 13 is off and will have a value substantially equal to the emitter voltage for transistor 13 minus about 0.3 volts when transistor 13 is on.

Referring now to the specific circuitry, the threshold voltage for the variable threshold amplifier circuit illustrated in FIG. 1 is set by varying the resistance setting for potentiometer 23. Typically, the threshold voltage would be set by measuring the voltage at the emitter of transistor 12 and changing the setting of potentiometer 23 until a desired threshold voltage is achieved.

Once the desired threshold voltage has been set, transistor 12 will be turned on only when the voltage at the base of transistor 12 is about 0.7 volts greater than the threshold voltage. Transistor 13 will be turned on only when transistor 12 is turned on. The value of the output voltage ($V_o$) will thus be zero volts until transistor 12 is turned on and then the output voltage will assume a binary 1 logic level when transistor 12 does turn on in the circuit illustrated in FIG. 1.

Figure 2:
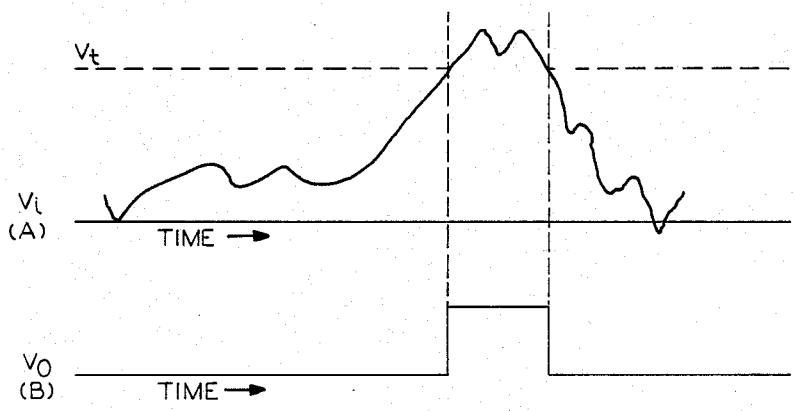
FIG. 2 is an illustration of typical input and output signals (no scale used) for the circuit illustrated in FIG. 1.

As an example of the operation of the circuit illustrated in FIG. 1, assume that a signal having the voltage level as a function of time of the signal illustrated in part A of FIG. 2 is applied to the base of transistor 11. Also assume that the threshold voltage for transistor 12 has been set at 2 volts. As is illustrated in FIG. 2, the output voltage will have a zero level until such time as the voltage applied to the base of transistor 11 exceeds 2 volts at which time the output voltage will almost immediately assume a logic 1 voltage level.

As a specific illustration of the operation of the circuit illustrated in FIG. 1, assume that the input signal illustrated in part A of FIG. 2 has reached a level of 3 volts. The emitter of transistor 11 will thus have a voltage of 3.7 volts as will the base of transistor 12. Since the base voltage for transistor 12 is more than 0.7 volts greater than the threshold voltage, transistor 12 will be on and the emitter voltage for transistor 12 will be 3 volts. Diode 31 will be reverse biased so there will be no current flow through diode 31. For the resistance values illustrated in FIG. 1, there will be a current flow of about 5.4 mA through resistor 21 and in like manner there will be a current flow of about 5.4 mA in the collector of transistor 12.

A portion of the collector current of transistor 12 will be drawn from the base of transistor 13 thus turning it on. Transistor 13 will be saturated with about 0.3 voltes (Vce sat.) between the collector and the emitter. With the values given for resistors 26 and 34 a collector current of about 19.4 mA will be established in transistor 13 resulting in an output voltage ($V_o$) of 4.27 volts.

The pnp transistor 13 may turn off slowly due to the stored charge of a saturated transistor. However, it is desirable for the output voltage to be in either one state or another if the voltage is to be used to drive TTL circuitry. Thus, the Schmitt trigger 41 is utilized to provide edge definition. Essentially, the output voltage will be about 3.4 volts when transistor 13 is turned off and will be about zero volts when transistor 13 is on.

The gain of the variable threshold amplifier illustrated in FIG. 1 is about 10. Specifically, the gain of transistor 12 is determined by the ratio of resistors 21 and 33 which is 1. The gain of transistor 13 is determined by the ratio of resistors 26 and 34 which is 10. Other gains could be utilized but it is desirable to have a high gain if a binary output is to be provided. Use of a lower gain will be illustrated in FIG. 3 where it is desired to have a linear amplification. Use of a high gain for transistor 13 results in early saturation of transistor 13 which would prevent linear amplification but does not affect a binary output.

Other advantageous features of the circuit illustrated in FIG. 1 is the high input impedance which would generally be the $\beta$ of transistor 11 multiplied by the value of resistor 44. The $\beta$ transistor 11 will generally range from about 50 to about 300. For a $\beta$ of 100, the input impedance would be about 56 k$\Omega$. Also, since transistor 11 is a pnp transistor and transistor 12 is an npn transistor, the nonlinear base emitter characteristics of transistor 11 will cancel the nonlinear base emitter characteristics of transistor 12. The variations of the circuit operation due to temperature variations will also be reduced by the NPN/PNP combination. Also, the use of a pnp transistor in combination with an npn transistor provides a means by which the threshold voltage can be set substantially to ground level since the emitter of transistor 11 will be 0.7 volts above the input signal voltage level. If the base of transistor 12 is 0.7 volts above the emitter voltage, transistor 12 will turn on and thus a very small signal could be utilized to turn transistor 12 on by setting the emitter voltage (threshold voltage) of transistor 12 to zero volts or ground level.

The Schottky diode 46 may be utilized to improve the recovery time of transistor 13 if transistor 13 becomes saturated.

Transistor 13 essentially provides a level shifting function as has been previously stated. For the circuit illustrated in FIG. 1, transistor 13 provides a means by which either a binary 0 or binary 1 can be provided as an output. Thus, even if the input signal illustrated in part A of FIG. 2 has a value of 1.9 volts, the output from the circuit illustrated in FIG. 1 will still be zero. This feature is particularly advantageous for linear amplification such as is illustrated in FIG. 3 since the amplification begins at zero volts and not the threshold voltage.

It is noted that the circuit illustrated in FIG. 1 could be utilized for linear amplification by deleting the Schmitt trigger 41. However, it would be desirable to reduce the gain of transistor 13 to use the circuit illustrated in FIG. 1 for linear amplification. Also, transistor 11 could be deleted and the input signal could be applied directly to the base of transistor 12 if desired but the advantages using transistor 11 would be lost.

Figure 4:
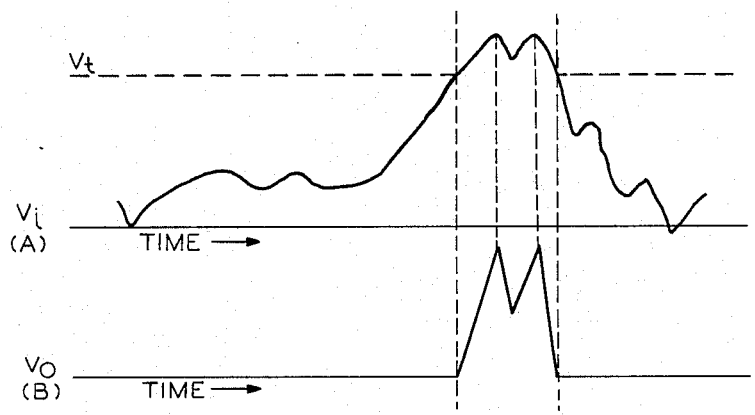
FIG. 4 is an illustration of the input and output signals (no scale used) for the circuit illustrated in FIG. 3.

Referring now to FIG. 3, there is illustrated a circuit which is essentially the same as the circuit illustrated in FIG. 1 except for the changing of resistor 34 in FIG. 1 to a potentiometer 51 in FIG. 3 and the deletion of the Schmitt trigger 41. The operation of the circuit illustrated in FIG. 3 is the same as the operation of the circuit illustrated in FIG. 1 with the exception that the gain of transistor 13 may be varied by varying the setting of the potentiometer 51. Also, a linearly amplified output signal is provided instead of the binary output of FIG. 1. In general, a lower gain than the grain of 10 illustrated in FIG. 1 will be utilized to prevent saturation of transistor 13 so that the linear amplification may be accomplished. For the input voltage $V_I$ of FIG. 4(A), which is the same as the input voltage illustrated in FIG. 2(A), the output voltage of the circuit illustrated in FIG. 3 would be essentially as illustrated in FIG. 4(B).

For FIGS. 1 and 3, transistors 11 and 13 are 2N3906. Transistor 12 is a 2N3904. Diode 31 is a 1N914. Diode 46 is a IN5712. Schmitt trigger 41 is a 74LS14.

The invention has been illustrated and described in terms of a preferred circuit as illustrated in FIGS. 1 and 3. It is again noted that the circuitry illustrated in FIGS. 1 and 3 is the preferred circuitry, and a number of changes could be made if desired such as changing resistance values, using different transistors, etc. Such changes are within the scope of the present invention, as claimed.

That which is claimed is:

1. A variable threshold amplifier comprising:
    an npn transistor having a base, emitter and collector;
    a first pnp transistor having a base, emitter and collector;
    a positive voltage supply, wherein the collector of said npn transistor is electrically connected through a first resistor to said positive voltage supply and is electrically connected to the base of said first pnp transistor, wherein the emitter of said first pnp transistor is electrically connected through a second resistor to said positive voltage supply, and wherein the collector of said first pnp transistor is electrically connected through a third resistor to a first reference voltage;
    a potentiometer having first and second terminals and a wiper, wherein the first terminal of said potentiometer is electrically connected to said positive voltage supply and the second terminal of said potentiometer is electrically connected to said first reference voltage;
    a diode having an anode and a cathode, wherein the anode of said diode is electrically connected through a fifth resistor to the wiper of said potentiometer and wherein the cathode of said diode is electrically connected to the emitter of said npn transistor and is electrically connected to said first reference voltage through a sixth resistor; and
    a second pnp transistor having a base, emitter and collector, wherein the emitter of said second pnp transistor is electrically connected through a fourth resistor to said positive voltage supply and is electrically connected to the base of said npn transistor and wherein the collector of said second pnp transistor is electrically connected to said first reference voltage; and
    means for providing a second signal having a voltage which varies as a function of time to the base of said second pnp transistor, wherein the voltage level of said second signal is increased by about 0.7 volts at the emitter of said second pnp transistor and is thus provided as said first signal to the base of said npn transistor.

2. A variable threshold amplifier in accordance with claim 1 additionally comprising:
    a Schmitt trigger; and
    means for providing the voltage across said third resistor to said Schmitt trigger, wherein the output of said Schmitt trigger is at said first reference voltage if the voltage of said first signal is not about 0.7 volts above said second reference voltage and wherein the output of said Schmitt trigger is at a voltage level suitable for representation of a binary one if said first signal has a voltage about 0.7 volts above said threshold voltage.

3. A variable threshold amplifier in accordance with claim 2 wherein said first reference voltage is zero volts.

* * * * *